United States Patent
Schaefer et al.

(10) Patent No.: US 6,723,250 B1
(45) Date of Patent: Apr. 20, 2004

(54) METHOD OF PRODUCING STRUCTURED WAFERS

(75) Inventors: Joerg Schaefer, Reutlingen (DE); Peter Linke, Reutlingen (DE); Albrecht Schwille, Reutlingen (DE); Helmut Baumann, Gomaringen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/238,262

(22) Filed: Jan. 27, 1999

(30) Foreign Application Priority Data

Jan. 28, 1998  (DE) .......................... 198 03 186

(51) Int. Cl.[7] .......................... H01L 21/302
(52) U.S. Cl. .............. 216/2; 216/41; 216/47; 216/99; 438/745; 438/753; 438/958
(58) Field of Search .............. 216/2, 41, 47, 216/99; 438/745, 753, 958

(56) References Cited

U.S. PATENT DOCUMENTS

| | | | | |
|---|---|---|---|---|
| 4,542,650 A | * | 9/1985 | Renken et al. ............... 73/204 |
| 4,957,592 A | * | 9/1990 | O'Neill ........................ 216/47 |
| 4,994,141 A | * | 2/1991 | Harms et al. ................ 216/2 |
| 4,996,627 A | * | 2/1991 | Zias et al. .................... 216/2 |
| 5,096,791 A | * | 3/1992 | Yahalom ...................... 430/5 |
| 5,131,978 A | * | 7/1992 | O-Neill ........................ 216/47 |
| 5,387,316 A | * | 2/1995 | Pennell et al. .............. 438/381 |
| 5,389,198 A | * | 2/1995 | Koide et al. ................. 216/2 |
| 5,711,891 A | * | 1/1998 | Pearce ......................... 216/51 |
| 5,738,757 A | * | 4/1998 | Burns et al. ................. 216/47 |
| 5,762,813 A | * | 6/1998 | Takiyama et al. ........... 216/67 |
| 5,804,090 A | * | 9/1998 | Iwasaki et al. .............. 216/99 |
| 6,033,997 A | * | 3/2000 | Perng ........................... 438/758 |

OTHER PUBLICATIONS

IBM Tech.Discl.Bull. "Improved Process for Through Hole Fabrication in Silicon" vol. 36, No. 5, pp. 121–122, May 1993.*

* cited by examiner

Primary Examiner—Anita Alanko
(74) Attorney, Agent, or Firm—Kenyon & Kenyon

(57) ABSTRACT

A method of producing structured wafers guarantees that the edge of the wafer will be protected from attack by an aggressive etchant medium without applying a photoresist to the edge and without using additional mechanical measures. In a type of negative process, a passivation layer is applied to the areas that are not to be structured, including the edge area of the wafer.

9 Claims, 2 Drawing Sheets

METHOD OF PRODUCING STRUCTURED WAFERS

BACKGROUND INFORMATION

Wet chemical etching methods of structuring wafers are already known. A photoresist method is generally used to define a structure. Increasing quality demands in production of integrated circuits and micromechanical sensor arrangements require removal of the photoresist from the wafers used, because otherwise residues of resist will be entrained throughout the various process steps in conveyance of the wafers. However, after the resist has been removed from the edge of the wafer, it is unprotected when exposed to etchant media.

SUMMARY OF THE INVENTION

The method according to the present invention has the advantage that passivation of the wafer edge is guaranteed despite removal of the resist there without having to use etching boxes, for example, to protect the wafer edge from the aggressive etchant medium. By combining wafer edge passivation as a negative process with the positive process of determining the areas to be etched subsequently, a method is provided which is inexpensive and nevertheless meets high quality demands. The wafer edge remains protected from etchant media without photoresist at the edge and without the use of etching boxes.

By removing a nitride layer only in subareas and then applying a thin passivation layer in the subareas, two or more step etching processes can also be carried out while preserving the wafer edge passivation.

It is especially advantageous to use an oxide layer as a passivation layer, which is applied in a LOCOS process (LOCOS="local oxidation of silicon").

DETAILED DESCRIPTION

Figure 1:
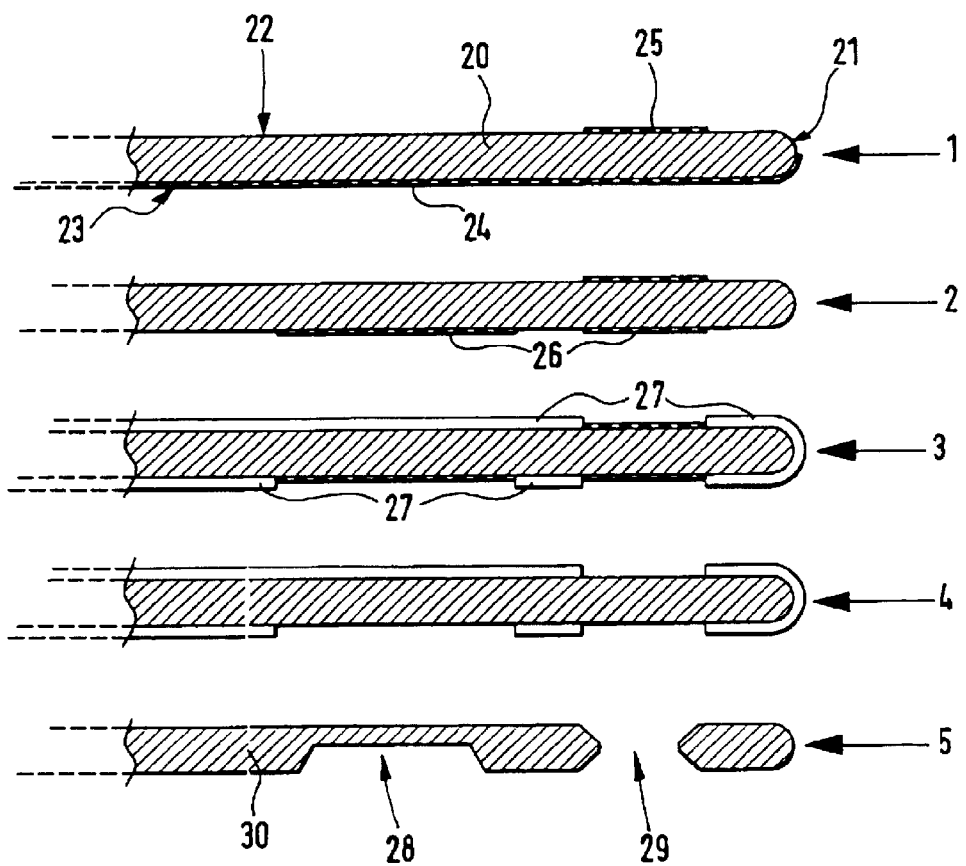
FIG. 1 shows a first embodiment of the method according to the present invention.

FIG. 1 shows a first embodiment of the method according to the present invention as a two-sided one-step etching process. Part 1 shows a cross-sectional view of wafer 20, which made be made of a single material, with a front side 22, a back side 23 and an edge area 21. The wafer is shown only partially, continuing toward the left, where it is delimited by another edge area (not shown). A nitride layer is applied to the wafer by gas phase deposition. Then the nitride layer is structured by a conventional photoresist technique, with the resist being applied to the nitride layer, exposed selectively and then developed; (when using a positive resist) the exposed part of the resist is next removed, then the exposed part of the nitride layer is removed, usually by a plasma etching process, and finally the remaining unexposed part of the resist is removed, e.g., by ashing the resist in an oxygen plasma. Nitride structuring is performed first on the front side of the wafer, as shown in Part 1; this structuring yields structured nitride layer 25. Unstructured nitride layer 24 is still imaged on the back side.

In another step, the nitride layer on the back side of the wafer is structured similarly; accordingly, Part 2 shows structured nitride layer 26 on the back side as the result of this nitride structuring. A passivation layer is applied in another step shown in Part 3. This embodiment shows an oxide layer 27 used as a passivation layer produced by selective growth in a thermal process, a LOCOS process, at about 1100° C. In another step, the nitride layer is removed selectively with regard to the oxide by a plasma etching process or by etching in hot phosphoric acid. The result is shown in Part 4: a wafer 20 with a structured oxide layer, with the oxide layer also completely surrounding wafer edge 21. In another step the silicon is etched by an anisotropic etching process, e.g., in a KOH bath. The etching process is performed until reaching the desired etching depth or until desired through hole 29 has been etched out. In another step the passivation layer is removed, e.g., by applying an etchant medium containing hydrofluoric acid. Part 5 shows the result of the etching step and removal of the passivation. Structured wafer 30, which is shown in cross section, has a through hole 29 and a cavern area 28.

Figure 2:
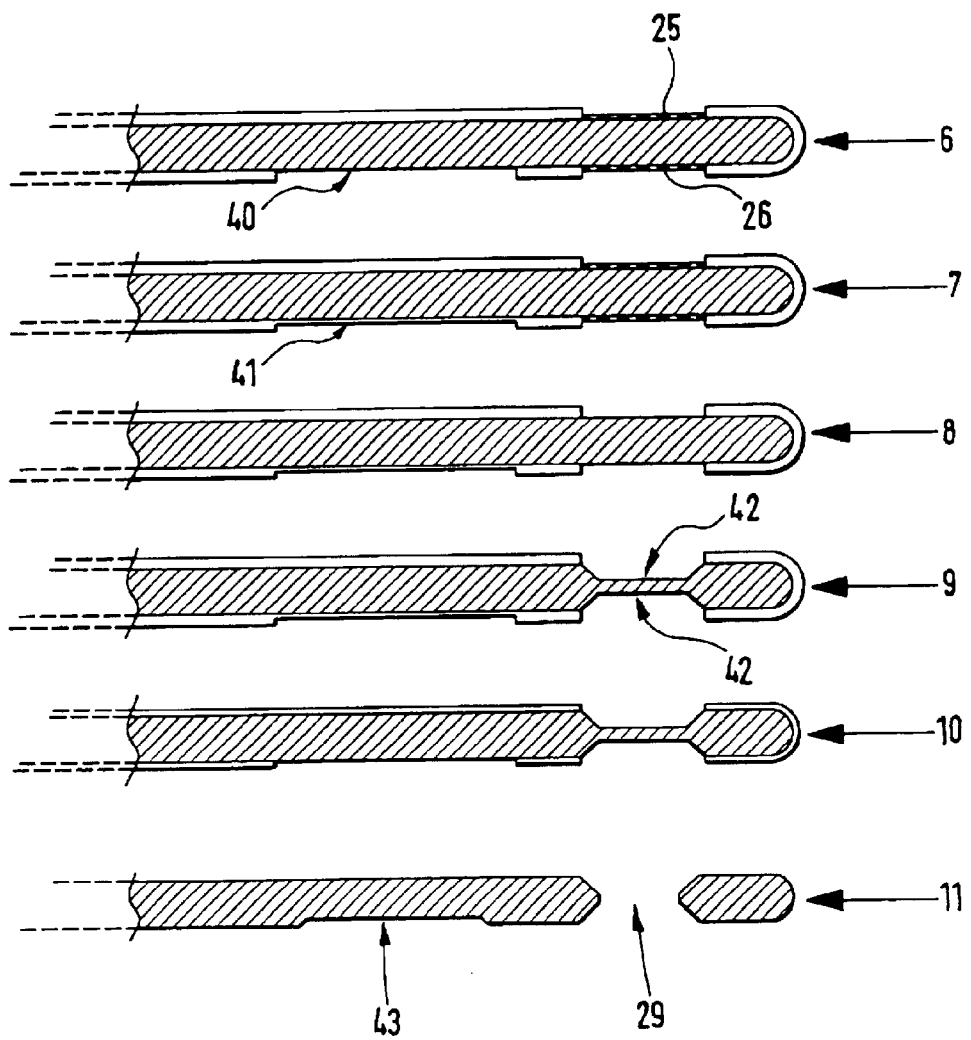
FIG. 2 shows a second embodiment of the method according to the present invention.

FIG. 2 shows another embodiment of the method according to the present invention. First the procedure described in Parts 1 through 3 of FIG. 1 is followed. In another step, however, the nitride layer is removed in a subarea 40 of the positive area of the surface of the wafer. The positive area is formed by the part of the surface of the wafer covered with the nitride layer. Then a photoresist method is used in the usual manner to obtain a structure like that shown in Part 6. Wafer 20 has a structured nitride layer 25 on the front side and a structured nitride layer 26 on the back side. The remainder of the surface of the wafer is covered with an oxide layer except for subregion 40. Then an oxide layer 41 is applied in subregion 40 in a second local oxidation (thermal oxidation process, LOCOS process). Here again, as in the first local oxidation, selectivity for the areas covered with a nitride layer is guaranteed. Part 7 shows the result of this process step: a wafer provided with a thin oxide layer 41 in subregion 40 and either a thick oxide layer or a nitride layer in other areas. In another step, the nitride is completely removed selectively with respect to the oxide in a plasma etching process.

The wafer with the structure illustrated in Part 8 is then exposed to a wet chemical etching process in a KOH bath. First the wafer is pre-etched in the area of through hole 29 to be formed later, in order to partially remove the silicon and produce recesses 42 on both sides (see Part 9). Then thin oxide layer 41 is removed in subregion 40 with a hydrofluoric acid etchant medium which attacks all areas of the silicon dioxide layer in the immersion bath; however, since the oxide layer in subregion 40 is thinner than the remaining layer, it can be removed completely selectively with respect to the remaining oxide layer in subregion 40 if the etching process with the hydrofluoric acid etchant medium is terminated as soon as thin oxide layer 41 is removed (Part 10). Finally, the wafer is etched in KOH until the silicon is removed to the final etching depths. Part 11 shows the structured wafer after subsequent removal of the passivation layer; it has a through hole 29 and a shallow cavern 43. A structuring of the wafer has been achieved through the procedure of a two-sided two-step KOH etching process illustrated in FIG. 2 in comparison with FIG. 1, resulting in a cavern 43 which is shallower than cavern 28 from FIG. 1.

Other structures with KOH etching of the front and/or back side in a one- or two-step KOH etching process can be derived easily from the embodiments shown in FIGS. 1 and 2. Of course, it is also possible to derive multi-step etching processes where more than two different oxide thicknesses are implemented to permit multiple gradations in the final etching depths. Important in all embodiments is the production of wafer passivation in a photoresist technique in a type of negative process where the resist has been removed in a preceding structuring operation, i.e., at the edge. In the embodiments, the positive areas are to be understood as the areas of the wafer surface covered with a nitride layer. The other areas of the surface of the wafer are negative areas, also including edge areas of the wafer, i.e., precisely the areas where passivation is to be guaranteed.

The standard IC photoresist technique with the usual removal of resist from the edges before exposure can be used as the photoresist technique. As an alternative, it is also possible to use photoresist methods where the resist is not removed from the edge of the wafer until after exposure of the photoresist or after exposure and developing of the photoresist.

What is claimed is:

1. A method of etching a wafer, comprising the steps of:

providing a wafer having a surface and edge areas;

dividing the surface of the wafer into positive areas and negative areas, the negative areas including the edge areas of the wafer;

providing the negative areas with a first passivation layer to protect the negative areas from a subsequent second etching process;

providing at least one of the positive areas with a second passivation layer having a thickness that is less than a thickness of the first passivation layer;

selectively removing the second passivation layer via a first etching process, the first etching process being terminated when the second passivation layer is completely removed;

subsequently etching the wafer via the second etching process;

removing the first passivation layer; and applying an oxide layer in a LOCOS process, wherein at least one of the first passivation layer and the second passivation layer includes the oxide layer.

2. The method according to claim 1, wherein the dividing step includes the sub-steps of:

applying a nitride layer; and structuring the nitride layer using a photoresist technique, wherein the positive areas of the surface of the wafer are defined by a part of the surface covered with the nitride layer.

3. The method according to claim 2, further comprising the step of removing the nitride layer at least in subareas of the positive areas after the negative areas are provided with the first passivation layer and before the wafer is etched.

4. The method according to claim 2, wherein the structuring step includes a step of removing a photoresist at at least one of the edge areas after exposing the photoresist.

5. The method according to claim 4, wherein the photoresist is removed after exposing and developing the photoresist.

6. The method according to claim 1, wherein the step of etching the wafer in the wet chemical etching process is performed so that at least one through hole is etched out.

7. The method according to claim 1, wherein the step of etching the wafer in the wet chemical etching process is performed so that a cavern area is formed in the vicinity of the at least one positive area provided with the second passivation layer.

8. The method according to claim 7, wherein the step of etching the wafer in the wet chemical etching process is performed so that at least one through hole is etched out.

9. The method according to claim 1, wherein the wafer is made of a single material.

* * * * *